United States Patent
Mansri et al.

(10) Patent No.: US 8,847,630 B2
(45) Date of Patent: Sep. 30, 2014

(54) HIGH SIDE DRIVER CIRCUIT

(75) Inventors: Mohammed Mansri, Toulouse (FR); Kamel Abouda, Saint Lys (FR); Ahmed Hamada, Toulouse (FR)

(73) Assignee: Freescale Semiconductor, Inc., Austin, TX (US)

( * ) Notice: Subject to any disclaimer, the term of this patent is extended or adjusted under 35 U.S.C. 154(b) by 135 days.

(21) Appl. No.: 13/284,395

(22) Filed: Oct. 28, 2011

(65) Prior Publication Data

US 2013/0106467 A1    May 2, 2013

(51) Int. Cl.
*H03K 3/00* (2006.01)
*H03K 17/14* (2006.01)

(52) U.S. Cl.
CPC ...... *H03K 17/145* (2013.01); *H03K 2217/0063* (2013.01)
USPC .......................................... 327/108

(58) Field of Classification Search
None
See application file for complete search history.

(56) References Cited

U.S. PATENT DOCUMENTS

| | | | | |
|---|---|---|---|---|
| 5,736,877 A | * | 4/1998 | Tihanyi | 327/77 |
| 6,538,479 B2 | * | 3/2003 | Bellomo et al. | 327/108 |
| 6,809,560 B1 | * | 10/2004 | Wrathall | 327/108 |
| 7,888,977 B2 | * | 2/2011 | Sheng | 327/110 |

* cited by examiner

*Primary Examiner* — Lincoln Donovan
*Assistant Examiner* — Khareem E Almo

(57) ABSTRACT

A driver circuit is provided that receives an ON or OFF logic control signal and further has: an output arranged to be connected to a load; a power switch, having a control terminal with a first current terminal connected to a first power supply and a second current terminal arranged to be connected to the output to drive the load; a control circuit of a first type arranged between the control terminal of the power switch and a second power supply; and a control circuit of a second type, arranged to couple the control terminal of the power switch to the first power supply when the control signal is in the OFF state.

20 Claims, 4 Drawing Sheets

'ON - DC'

'ON - AC'

HIGH SIDE DRIVER CIRCUIT

BACKGROUND

1. Field of the Invention

This invention relates to a driver circuit and to an integrated circuit.

2. Background of the Invention

Driver circuits, in particular high side driver circuits (also known as high side switches), are commonly used in various electronic applications. A challenging aspect of the design of such driver circuits relates to the control of the state of the circuits with a high level of reliability under bad conditions of operation. Bad conditions of operation include, for instance, operation under strong ElectroMagnetic Interference (EMI) disturbances.

In particular, if the desired state of the circuit is OFF, any inadvertent change to the ON state is to be avoided and, conversely, if the desired state of the circuit is ON, any inadvertent change to the OFF state is also to be avoided. The compliance of the circuit with such requirements may be assessed using standard testing methods like, for instance, "Direct Power Injection" (DPI) or "Bulk Current Injection" (BCI) testing methods.

Existing design solutions may not be sufficiently robust against certain EMI disturbances.

BRIEF DESCRIPTION OF THE DRAWINGS

Further details, aspects and embodiments of the invention will be described, by way of example only, with reference to the drawings. In the drawings, like reference numbers are used to identify like or functionally similar elements. Elements in the figures are illustrated for simplicity and clarity and have not necessarily been drawn to scale.

DETAILED DESCRIPTION

Figure 1:
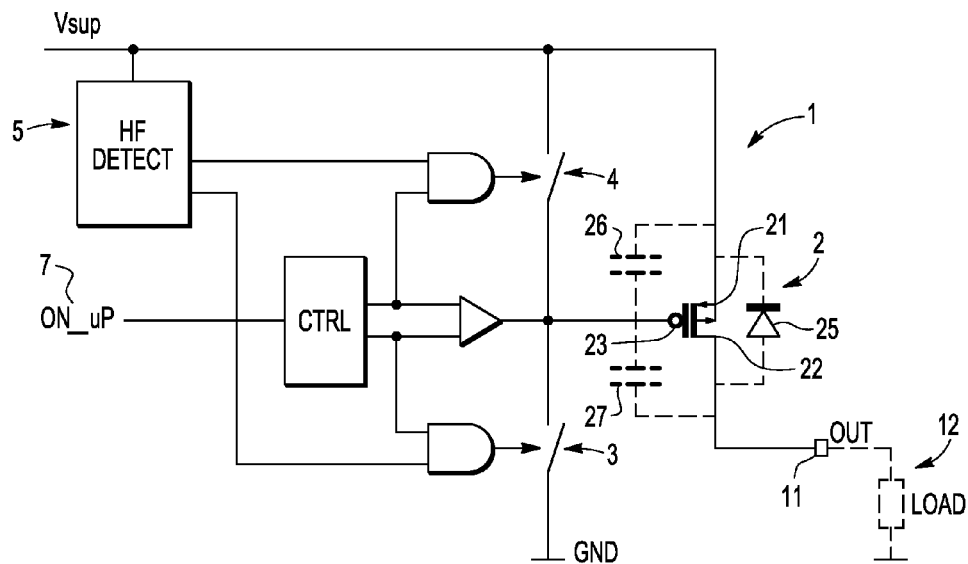
FIG. 1 schematically shows a block diagram of an example of an embodiment of a high side driver circuit.

FIG. 1 shows schematically a driver circuit 1, for instance a high side driver circuit, arranged to selectively provide a first power supply to a load 12, for instance a positive power supply, e.g. a positive supply voltage Vsup. It will be apparent that, where in the shown example a positive supply voltage Vsup is used, another reference voltage may be suitable for driving the load. Such other reference voltage may, for instance, be generated from the positive supply voltage, or received from the exterior of the IC.

In addition, it will be further apparent that the present invention is not intended to be limited to a high side driver circuit. Though the concept is elucidated herein with the examples of a high side driver circuit, the one with ordinary skills in the art will understand that the driver circuit may also be implemented as a low side driver circuit. In such as case, the first power supply may be, for instance, a negative supply voltage or the ground potential.

The driver circuit may comprise an input, e.g. a control input, arrange to receive a logic control signal controlling the logic state ON or OFF of the driver circuit.

The shown example of a driver circuit 1 comprises a power switch 2. The power switch may be implemented in any manner suitable for the specific implementation. In the shown example, the power switch comprises a transistor (e.g. a P-type transistor, such as a P-channel Field Effect Transistor (FET) or a P-channel Metal Oxide Semiconductor FET (P-channel MOSFET), also known as PMOS transistor). It will be apparent, however, that the power switch may be implemented in any manner suitable for the specific implementation. For instance, it may comprise one of the following: a P-type Bipolar Junction Transistor (BJT), a PNP transistor, or an Insulated Gate Bipolar Transistor (IGBT). The power switch 2 shown in FIG. 1 has a control terminal (e.g., gate 23), a first current terminal (e.g., source 21), and a second current terminal (e.g., drain 22). Source 21 is connected to the first power supply (e.g., positive supply voltage Vsup). Drain 22 is connected to output 11. Thus connected, power switch 2 is arranged to drive load 12 which may be connected to output 11. Load 12 can be any type of load, not necessarily a high power load.

When the driver circuit is implemented in an integrated circuit (IC) having a LIN wakeup line or a LIN supply line, output 11 of driver circuit 1 can be arranged to be connected to the LIN wakeup line or the LIN supply line of the IC. However, it will be apparent that any type of load can be driven by the driver circuit of the present invention, for instance an electric motor or an actuator of a vehicle for actuating, for example, a windshield wiping system, an electric window, a air-gas mixture throttle, an Exhaust Gas Recirculation (EGR) valve, and the like.

A high side driver circuit 1 as shown in FIG. 1 comprises a first control circuit of a first type, comprising a pull down circuit 3, arranged between the control terminal (e.g. gate 23) of the power switch (e.g. PMOS transistor 2) and second power supply. In the shown example, the second power supply may be the ground Gnd of the circuit. The control signal (denoted ON_µP) which is received on the control input 7 of driver circuit 1 is adapted to control the state ON or OFF of driver circuit 1 through pull down circuit 3. Thus connected, pull down circuit 3 couples gate 23 of PMOS transistor 2 to the ground when the ON_µP signal is in the ON state.

Further, the high side driver circuit 1 shown in FIG. 1 may comprise a first control circuit of a second type, comprising a pull up circuit 4, arranged to couple the control terminal (e.g. gate 23) of the power switch to the first power supply (e.g. positive supply voltage Vsup). The pull up circuit 4 is arranged to couple when the control input is in the OFF state.

Preferably, parasitic capacitances 26 and 27 of PMOS transistor 2 as shown are taken into account in the design of the application. In the shown example, these parasitic capacitances comprise a first capacitance 26 between the gate and the source of the PMOS transistor, and a second capacitance 27 between the gate and the drain of said PMOS transistor. Further, a parasitic diode 25 is present between the drain and the source of the PMOS transistor. The parasitic capacitances 26 and 27 and the parasitic diode 25 may generate dysfunctions of the driver circuit in case of interferences, e.g. EMI disturbances in the power supply, like for example an inadvertent change of the logic state of the power switch and, hence, of the driver circuit.

A detection circuit 5 may be arranged to sense any oscillations in the first power supply which may be due, for instance, to EMI disturbances affecting the power supply. In some embodiments, detection circuit 5 may implemented to detect voltage and/or current oscillations in the first power supply (e.g. positive supply voltage Vsup). When such voltage or current oscillations are detected, detection circuit 5 operates in combination with a control circuit 'Ctrl' to control the logic state ON or OFF of power switch 2 through pull down circuit 3 and pull up circuit 4 based on the control signal ON_μP, as will be explained in further details below. Thereby, it can be ensured that any inadvertent change of the logic state of the power switch 2 is avoided even in case of EMI disturbances, e.g. voltage or current oscillations in the first power supply. The oscillation detection circuit 5 may be arranged to detect voltage or current oscillations in the High Frequency (HF), namely radiofrequency range, that is to say oscillations with frequencies above the audio frequency range of, e.g., 4 kilohertz (kHz) to 20 kHz.

Figure 2:
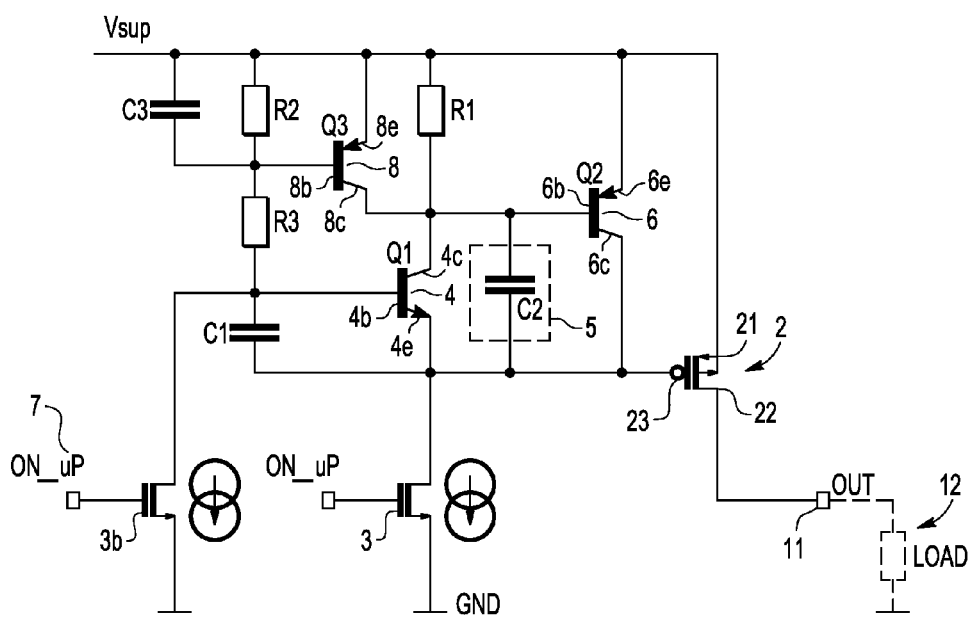
FIG. 2 schematically shows a circuit diagram of an example of an embodiment of the driver circuit of FIG. 1.

In the example of implementation of the driver circuit of FIG. 1 shown in FIG. 2, the first pull up circuit 4 comprises a first pull up transistor Q1 (4) arranged to couple gate 23 of power switch 2 to the positive supply voltage Vsup. Said first pull up transistor Q1 (4) may be a N-type Bipolar Junction Transistor (BJT), for example a NPN transistor. The first pull up transistor Q1 (4) is conductive when control input 7 is in the OFF state. One current terminal (e.g. collector 4c) of the first pull up transistor Q1 (4) may be connected to the positive supply voltage Vsup through a first resistor R1. The other current terminal (e.g. emitter 4e) of the first pull up transistor Q1 (4) may be connected to gate 23 of power switch 2.

Further, there may be provided a second control circuit of the second type, e.g. a pull up circuit 6, comprising for instance a second pull up transistor Q2 (6). This second pull up transistor is arranged to couple the gate 23 of the power switch 2 to the positive supply voltage Vsup. In the shown example, said second pull up transistor Q2 (6) is also P-type BJT e.g. a PNP transistor. One current terminal (e.g. emitter 6e) of the second pull up transistor Q2 (6) may be connected to the positive supply voltage Vsup and the other current terminal (e.g. collector 6c) of the second pull up transistor Q2 (6) may be connected to gate 23 of power switch 2.

The oscillation detection circuit 5 may comprise a capacitor device C2 (5) connecting base 6b of the second pull up transistor Q2 (6) to gate 23 of the power switch (e.g. PMOS transistor 2). The behaviour of this capacitor device C2 (5) in presence of EMI disturbances in the positive supply voltage Vsup will be detailed below.

The second pull up transistor Q2 (6) is arranged to be activated (i.e., becomes conductive) upon detection of oscillations by the oscillation detection circuit 5, as it will become apparent from the description below.

Further, there may also be provided a third control circuit of the second type, e.g. a pull up circuit, for instance comprising a third pull up transistor Q3 (8) arranged to couple the base 6b of the second pull up transistor Q2 (6) to the positive supply voltage Vsup. Said third pull up transistor Q3 (8) may be P-type BJT, e.g. a PNP transistor, as in the shown example. One current terminal (e.g. emitter 8e) of the third pull up transistor Q3 (8) may be connected to the positive supply voltage Vsup and the other current terminal (e.g. collector 8c) of Q3 (8) may be connected to the control terminal (e.g. base 6b) of the second pull up transistor Q2 (6).

The control terminal (e.g. base 8b) of the third pull up transistor Q3 (8) may be connected to the positive supply voltage Vsup through a second resistor R2. The base 8b may further be connected to the base 4b of the first pull up transistor Q1 (4) through a third resistor R3.

Further, there may still be provided a first auxiliary capacitor device C1, arranged between the base 4b of the first pull up transistor Q1 (4) and the gate 23 of the power switch 2.

Still further, there may also be provided a second auxiliary capacitor device C3, arranged between the positive supply voltage Vsup and the base 8b of the third pull up transistor Q3 (8).

In the shown example, the driver circuit 1 further comprises a second control circuit of the first type, e.g. a pull down circuit 3b. While the first pull down circuit 3 is arranged to couple the gate 23 of the power switch 2 to the ground Gnd, the second pull down circuit 3b is arranged to couple the base 4b of the first pull up transistor Q1 (4) to said ground Gnd.

The first pull down circuit 3 may be arranged and sized to provide current limitation, thanks to a suitable current source arrangement. For instance, it may be arranged to sink a current comprised between, e.g. 5 micro-amps (μA) and 50 μA, to the ground Gnd. The second pull down circuit 3b may also be arranged to provide current limitation, thanks to a further suitable current source arrangement. It may be arranged to sink a current comprised between, for example, 5 μA and 50 μA to the ground Gnd.

In the shown example, first pull down circuit 3 may be arranged to sink a current of 10 μA and second pull down circuit 3b is arranged to sink a current of 40 μA.

Both first pull down circuit 3 and second pull down circuit 3b are controlled simultaneously by the signal denoted 'ON_μP' received through the control input 7.

Driver circuit 1 of the shown example operates as will be explicated, with reference to FIGS. 3 to 6, in what follows.

Figure 3:
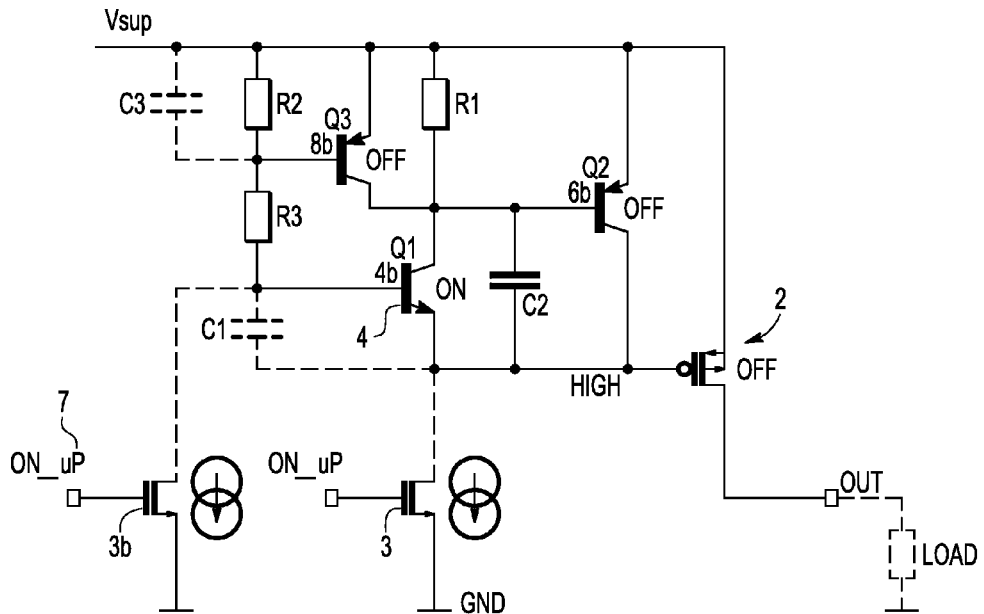
FIG. 3 schematically shows the circuit diagram of FIG. 2, in the OFF state in a condition free of EMI disturbances.

FIG. 3 shows driver circuit 1 of the example of embodiment of FIG. 2 in the OFF state in a condition without EMI disturbances in the positive supply voltage Vsup (also named by the vocable 'DC', standing for 'direct current'). Stated otherwise, the positive supply voltage Vsup is substantially free of any interference like ElectroStatic Discharge (ESD), High Frequency (HF) coupling, EMI conducted interference, and the like. As will be apparent to the one with ordinary skill in the art, the term "High Frequency (HF)" refers to frequencies above the acoustic range of, for example, 40 Hz-20 kHz, and may also be referred to as "radiofrequency".

Under such conditions, capacitors C1, C2, C3 (C1, C3 being shown in phantom lines in FIG. 3) behave as open circuit devices in stable state.

Control input 7 is at a logical low state and, consequently, both of the first current driver 3 and the second current driver 3b are in the OFF state. Thus, they do not drive gate 23 of the power switch 2 and the base 4b of first pull up transistor Q1 (4) to the ground. Resistors R2 and R3 act as pull up resistors drawing the base 4b of transistor Q1 (4) up toward the logical high state, and consequently transistor Q1 (4) is turned in the ON state. First pull up transistor Q1 (4) draws current through the first resistor R1 to supply the gate 23 of the power switch 2 with a logical high level, i.e. corresponding to ca. the Vsup voltage. As a result, the voltage difference between source 21 and gate 23 of power switch 2 is not sufficient to trigger the conduction of the main P-type transistor 2, and therefore power switch 2 is in the OFF state. Base 6b of second pull up transistor Q2 (6) is high and therefore the second pull up transistor Q2 (6) is in the OFF state. In the same manner, base 8b of third pull up transistor Q3 (8) is high and therefore the third pull up transistor Q3 (8) is in the OFF state.

Further, in this state, capacitors C1, C2 and C3 are not substantially charged since no substantial voltage difference appears at their respective terminals.

Figure 4:
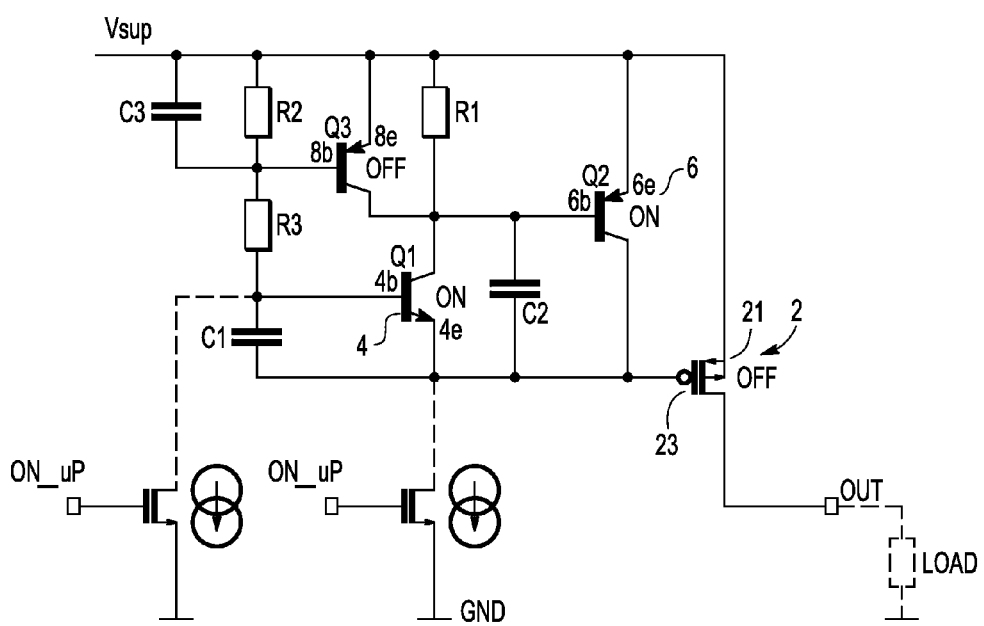
FIG. 4 schematically shows the circuit diagram of FIG. 2, in the OFF state in presence of EMI disturbances.

FIG. 4 shows driver circuit 1 of the example of embodiment of FIG. 2 in the OFF state in presence of interference, i.e. with some EMI disturbances leading to voltage or current oscillations in the positive supply voltage Vsup. Such oscillations may have a spectral profile as wide as 1 MHz to 1 GHz. This condition is also named by the vocable 'AC', standing for 'alternating current'.

Upon a rising edge of said oscillation, capacitor C2 tends to keep the charge previously prevailing, i.e. a very low voltage. Therefore, capacitor C2 keeps base 6b to the previous voltage, whereas emitter 6e has a higher voltage. Therefore, second pull up transistor Q2 (6) turns ON. Thereby, second pull up transistor Q2 (6) connects gate 23 of power switch 2 to the positive supply, thereby preventing the occurrence of a sufficient voltage between gate 23 of power switch 2 and source 21. As a result, P-type transistor 2 stays OFF.

The auxiliary capacitor C3 tends to keep the charge previously prevailing, i.e. a very low voltage, thereby preventing the occurrence of a sufficient voltage between emitter 8e and base 8b and therefore prevents third pull up transistor Q3 (8) to turn ON.

In the same manner, auxiliary capacitor device C1 tends to keep the charge previously prevailing, i.e. the Q1 (4) transistor forward voltage drop, and thereby helps keep first pull up transistor Q1 (4) in the ON state.

Thanks to this arrangement, when the driver circuit 1 is in the OFF state and upon conducted interferences incoming on the power supply, voltage oscillations are detected by the HF detection circuit and the second pull up transistor Q2 (6) turns ON which avoids an inadvertent activation of power switch 2.

Figure 5:
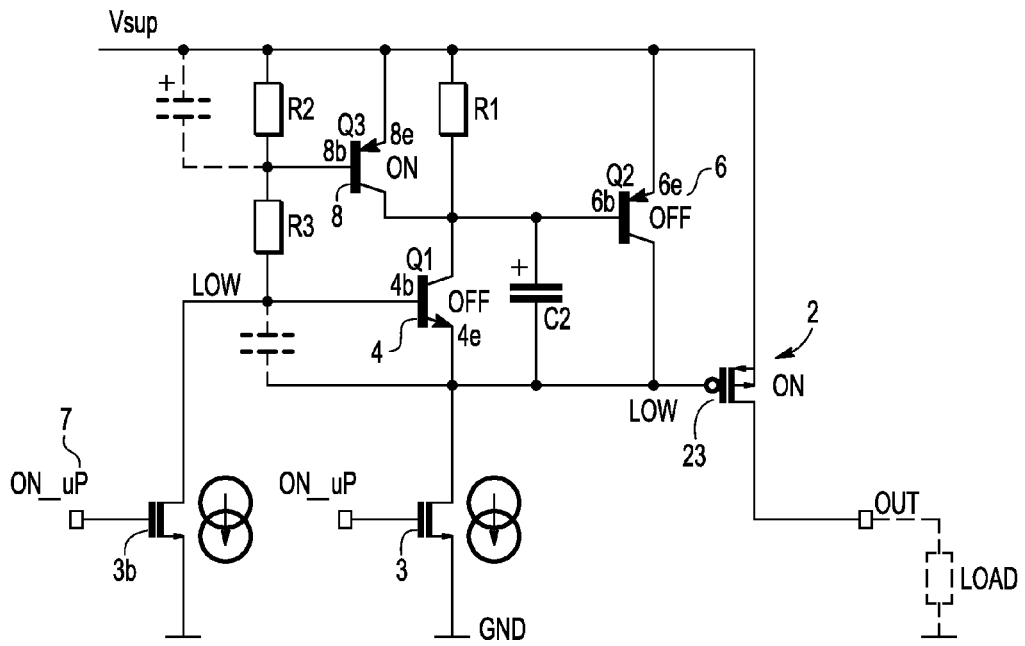
FIG. 5 schematically shows the circuit diagram of FIG. 2, in the ON state in a condition free of EMI disturbances.

FIG. 5 shows driver circuit 1 of the example of embodiment of FIG. 2 in the ON state, in a condition without interference. Control input 7 is at a high logical state and consequently both of first current driver 3 and second current driver 3b are in the ON state. They draw the voltage at gate 23 of power switch 2 and at base 4b, respectively, to the ground through the current sources.

Since base 4b is at the same voltage as emitter 4e, first pull up transistor Q1 (4) stays in the OFF state. If it was previously in the ON state, second current driver 3b forces the voltage of base 4b below the Q1 threshold voltage thereby turning in the OFF state.

Thanks to the resistor bridge formed by R2 and R3, which operates as a voltage divider, the voltage of base 8b is lower than the voltage of emitter 8e, and therefore third pull up transistor Q3 (8) is in the ON state, or is turned ON if it was OFF previously.

Since third pull up transistor Q3 (8) is conducting, it connects base 6b of transistor Q2 (6) with emitter 6e, thereby turning second pull up transistor Q2 (6) into the OFF state, or keeping it OFF if it was already OFF.

In this logical state of the driver circuit, capacitor C2 is charged, substantially to the positive supply voltage Vsup, while capacitor C1 is substantially not charged, and capacitor C3 is partially charged to a voltage which depends on the division ratio of the voltage divider R2/R3.

Figure 6:
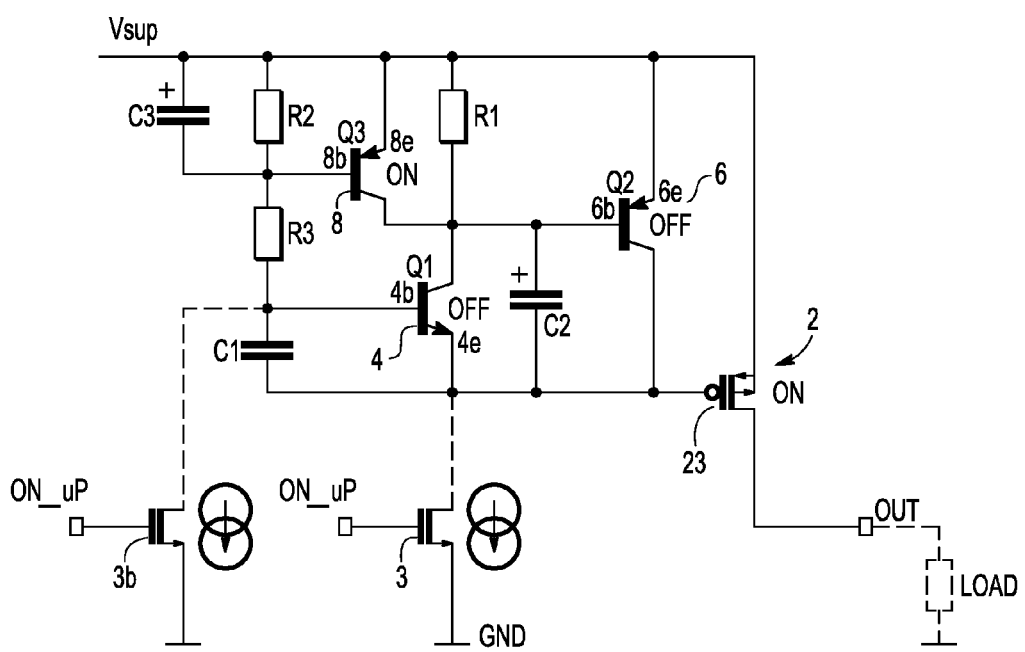
FIG. 6 schematically shows the circuit diagram of FIG. 2, in the ON state in presence of EMI disturbances.

FIG. 6 shows the driver circuit 1 of the example of embodiment of FIG. 2 in the ON state in presence of EMI disturbances.

Before the appearance of any EMI disturbance, starting from the ON state as shown in FIG. 5, capacitor C2 is charged to a voltage close to Vsup. However, capacitor C3 is charged to a charge proportional to the ratio R2/(R2+R3) and capacitor C1 is not charged (having essentially the same electrical potential at both of its terminals).

Therefore, when EMI disturbances occurs, the voltage across capacitor C3 keeps a substantially constant value and helps keeping a sufficient voltage difference between emitter 8e and base 8b of transistor Q3 (8) so that said transistor Q3 (8) stays in the ON state. Further, capacitor C1 keeps a substantially low charge, so that no sufficient voltage difference exists between emitter 4e and base 4b of transistor Q1 (4) to activate said transistor, and therefore transistor Q1 (4) stays in the OFF state.

Since Q3 stays ON, no sufficient voltage difference arises between emitter 6e and base 6b, and consequently Q2 (6) stays OFF.

Since Q1 and Q2 stay OFF, the voltage of gate 23 of power switch 2 stays low and therefore power switch 2 stays ON. This also provides an advantage that the logical state of the power switch 2 is maintained stable in presence of EMI disturbances. Thus any inadvertent change in its logical state is avoided.

Regarding the change from 'ON-DC' to 'OFF-DC', first current driver 3 and second current driver 3b are interrupted. Therefore, the voltage of base 4b rises due to the pull up resistors R2 and R3. Therefore, transistor Q1 (4) turns ON. The voltage at the base 8b of transistor Q3 (8) also rises, thereby turning Q3 (8) into the OFF state, after the discharge of capacitor C3. Simultaneously, capacitor C2, starting from a substantial charge, contributes to keeping the base 6b of transistor Q2 (6) at a sufficient voltage to keep the emitter-base voltage of said transistor Q2 (6) below a threshold voltage, thereby keeping Q2 (6) in the OFF state.

Figure 7:
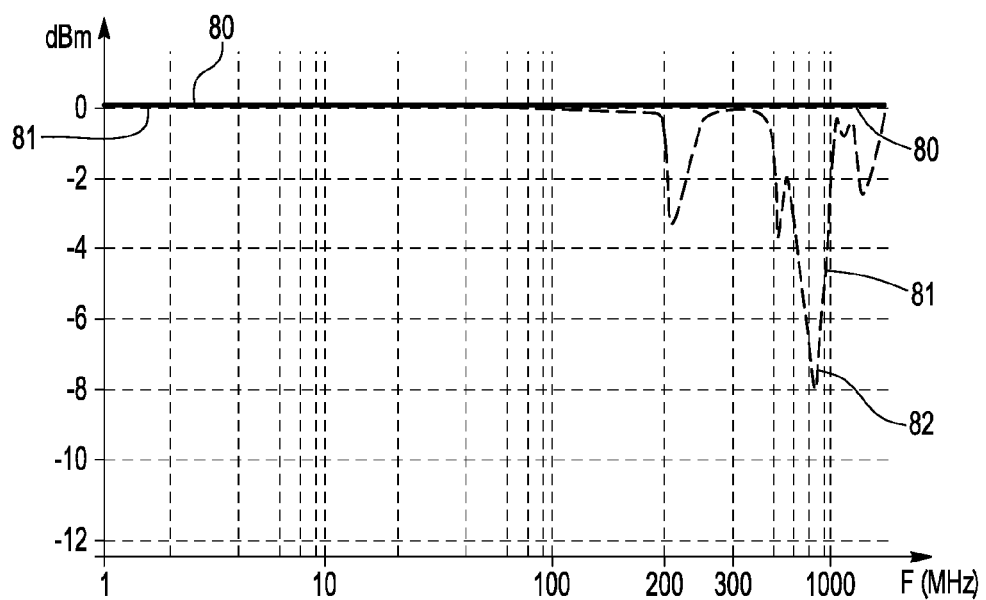
FIG. 7 is a graph of the spectral responses of the driver circuit on FIG. 2 in presence of EMI disturbances.

The plots of FIG. 7 show the spectral responses in presence of EMI disturbances obtained, for example, using one of the DPI and BCI testing methods. Curve 81 depicts the susceptibility level versus frequency in high side drivers of the prior art, whereas curve 80 depicts the susceptibility level versus frequency of the driver circuit 1 of the shown embodiment, in a frequency range up to a few thousand megahertz (MHz). A driver circuit of the prior art exhibits problems, appearing in the form of drifts like drift 82 in the spectral response at approximately 200 MHz, 400 MHz, and 1100 MHz. In contrast, the driver circuit 1 of the shown embodiment exhibits a flat spectral response over the shown frequency range.

In the foregoing specification, the invention has been described with reference to specific examples of embodiments of the invention. It will, however, be evident that various modifications and changes may be made therein without departing from the broader spirit and scope of the invention as set forth in the appended claims.

Because the illustrated embodiments of the present invention may for the most part, be implemented using electronic components and circuits known to those skilled in the art, details will not be explained in any greater extent than that considered necessary as illustrated above, for the understanding and appreciation of the underlying concepts of the present invention and in order not to obfuscate or distract from the teachings of the present invention.

However, modifications, variations and alternatives are also possible. The specifications and drawings are, accordingly, to be regarded in an illustrative rather than in a restrictive sense.

For instance, though the pull up circuits and pull down circuits have been described in examples where they are implemented as single transistors, it will be apparent that more complex structures may be implemented, e.g. using more transistors and/or other components suitable for the specific implementation. Further, though examples have been described where the transistors of the pull up circuits are P-type BJT, it will be appreciated that P-type FET, e.g. PMOS transistors can be used instead. Conversely, though examples have been described where the transistors of the pull down circuits are N-type FET, it will be appreciated that N-type BJT, e.g. NPN transistors can be used.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or an limits any particular claim containing such introduced claim element to inventions containing only one such element, even when the same claim includes the introductory phrases one or more or at least one and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Although specific conductivity types or polarity of potentials have been described in the examples, it will be appreciated that conductivity types and polarities of potentials may be reversed.

Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

The invention claimed is:

1. A driver circuit comprising:
   an input arranged to receive a logic control signal controlling a logic state ON or OFF of the driver circuit;
   an output arranged to be connected to a load;
   a power switch, having a control terminal, a first current terminal connected to a first power supply and a second current terminal arranged to connected to the output to drive the load;
   a first control circuit of a first type arranged between the control terminal of the power switch and a second power supply;
   a first control circuit of a second type, arranged to couple the control terminal of the power switch to the first power supply when the control signal is in the OFF state;
   an oscillation detection circuit to detect voltage or current oscillations in the first power supply; and
   a second control circuit of the second type arranged to couple the control terminal of the power switch to the first power supply upon detection of voltage or current oscillations in the first power supply by the oscillation detection circuit.

2. The driver circuit of claim 1, wherein
   the first control circuit of the first type comprises a pull down circuit; and the first and second control circuits of the second type each comprise a pull up circuit.

3. The driver circuit of claim 2, wherein the pull down circuit of the first control circuit of the first type comprises:
   a first pull down transistor arranged to be conductive when the control signal is in the ON state.

4. The driver circuit of claim 3, wherein the first pull down transistor is a N type BJT, namely a NPN transistor.

5. The driver circuit of claim 2, wherein the pull up circuit of the first control circuit of the second type comprises:
   a first pull up transistor arranged to be conductive when the control signal is in the OFF state.

6. The driver circuit of claim 2, wherein the pull up circuit of the second control circuit of the second type comprises:
   a second pull up transistor arranged to be conductive upon detection of voltage or current oscillations in the first power supply by the oscillation detection circuit.

7. A driver circuit comprising:
   an input arranged to receive a logic control signal controlling a logic state ON or OFF of the driver circuit;
   an output arranged to be connected to a load;
   a power switch, having a control terminal, a first current terminal connected to a first power supply and a second current terminal arranged to connected to the output to drive the load;
   a first control circuit of a first type arranged between the control terminal of the power switch and a second power supply;
   a first control circuit of a second type, arranged to couple the control terminal of the power switch to the first power supply when the control signal is in the OFF state;
   an oscillation detection circuit arranged to detect voltage or current oscillations in the first power supply;
   a second control circuit of the second type arranged to couple the control terminal of the power switch to the first power supply upon detection of voltage or current oscillations in the first power supply by the oscillation detection circuit; and a third control circuit of the second type arranged to couple the control terminal of the second pull up transistor to the first power supply.

8. The driver circuit of claim 6, wherein the oscillation detection circuit comprises a capacitor device connected between the control terminal of the power switch and a control terminal of the second pull up transistor.

9. The driver circuit of claim 3 further comprising:
a second control circuit of the first type arranged to couple a control terminal of the first pull up transistor to the second power supply.

10. The driver circuit of claim 9, wherein
one or more of the first control circuit of the first type and the second control circuit of said first type each comprise a current source circuit arranged to sink a current to the second power supply, and
the current is between 5 µA and 50 µA.

11. The driver circuit of claim 9, wherein the second control circuit of the first type comprises a pull down circuit.

12. The driver circuit of claim 11, wherein the pull down circuit of the second control circuit of the first type comprises a transistor arranged to be conductive when the control signal is in the ON state.

13. The driver circuit of claim 1, wherein the oscillation detection circuit is arranged to detect voltage or current oscillations in the radiofrequency range.

14. The driver circuit of claim 1, wherein a control terminal of the first control circuit of the first type is connected to the first power supply via a first resistor.

15. A driver circuit comprising:
an input arranged to receive a logic control signal controlling a logic state ON or OFF of the driver circuit;
an output arranged to be connected to a load;
a power switch, having a control terminal, a first current terminal connected to a first power supply and a second current terminal arranged to connected to the output to drive the load;
a first control circuit of a first type arranged between the control terminal of the power switch and a second power supply wherein a control terminal of the first control circuit of the first type is connected to the first power supply via a first resistor;
a first control circuit of a second type, arranged to couple the control terminal of the power switch to the first power supply when the control signal is in the OFF state;
an oscillation detection circuit arranged to detect voltage or current oscillations in the first power supply;
a second control circuit of the second type arranged to couple the control terminal of the power switch to the first power supply upon detection of voltage or current oscillations in the first power supply by the oscillation detection circuit; and
a third control circuit of the second type arranged to couple the control terminal of the second pull up transistor to the first power supply, wherein the third control circuit of the second type comprises a pull up circuit.

16. The driver circuit of claim 15, wherein the pull up circuit of the third control circuit of the second type comprises a third pull up transistor having a control terminal coupled to the first power supply.

17. The driver circuit of claim 15, wherein a control terminal of the pull up circuit of the third control circuit of the second type is connected to the first power supply via a second resistor.

18. The driver circuit of claim 15, wherein the control terminal of the third control circuit of the second type is connected to the control terminal of the first pull up transistor via a third resistor.

19. An integrated circuit comprising a driver circuit according to claim 2.

20. The driver circuit of claim 1, wherein a second control circuit of the first type comprises a pull down circuit.

* * * * *